United States Patent [19]

Baueregger et al.

[11] Patent Number: 4,871,117
[45] Date of Patent: Oct. 3, 1989

[54] LOW-CONTAMINATION METHOD FOR COMMINUTING SOLID SILICON FRAGMENTS

[75] Inventors: Rolf Baueregger, Burgkirchen, Fed. Rep. of Germany; Erich Bildl, Post Franking, Austria; Josef Dietl, Neuotting, Fed. Rep. of Germany

[73] Assignee: Heliotronic Forschungs- und Entwicklungsgesellschaft fur Solarzellen- GmbH, Burghausen, Fed. Rep. of Germany

[21] Appl. No.: 327,025

[22] Filed: Mar. 22, 1989

[30] Foreign Application Priority Data

Mar. 31, 1988 [DE] Fed. Rep. of Germany ....... 3811091

[51] Int. Cl.$^4$ ............................................. B02L 23/08
[52] U.S. Cl. ......................................... 241/23; 241/24
[58] Field of Search ................................ 241/1, 23, 24

[56] References Cited

U.S. PATENT DOCUMENTS 4,565,913  1/1986  Yakurugi et al. ................. 241/23 X
4,659,022  4/1987  Seider et al. .......................... 241/23
4,722,483  2/1988  Saville et al. ......................... 241/23
4,771,950  9/1988  Coblenr et al. ....................... 241/23

Primary Examiner—Timothy V. Eley
Attorney, Agent, or Firm—Collard, Roe & Galgano

[57] ABSTRACT

A method for lowering the risk of contamination during comminution of solid silicon fragments produces in a first step a temperature gradient in the solid silicon fragments. This temperature gradient results from the action of heat applied from the outside. A second temperature gradient is then produced, whose direction is rapidly at least partly reversed in a second step. This treatment effects a decompacting which makes it possible to use, in a subsequent mechanical comminution step, tools whose contact surfaces are composed of silicon or of hard materials, for example, based on nitride or carbide. The product obtained is remarkable for its uniform grain size distribution and also for its high purity in fine grain size categories. In addition, the low forces required for the comminution makes possible a longer service life for the tools used.

10 Claims, No Drawings

4,871,117

LOW-CONTAMINATION METHOD FOR COMMINUTING SOLID SILICON FRAGMENTS

BACKGROUND OF THE INVENTION

1. Field of the Invention

This invention relates to a low-contamination method for comminuting solid silicon fragments. In particular, the invention relates to a method in which a heating and cooling step is utilized to produce stress fractures in a silicon block prior to comminuting.

2. Description of the Prior Art

During the production of silicon wafers, which are the material for electronic components or solar cells, various substeps require the silicon to be used in a relatively finely divided form and often also in certain grain size ranges. This applies, in particular, to those process steps in which the silicon present in solid form is melted down in melting crucibles. The melted silicon is then reconverted to the solid state from the molten state with the development of the particular desired crystallized structural features. An example of this is the Czochralski crucible pulling technique in which a seed crystal is used to pull a monocrystalline silicon ingot of a particular crystallographic orientation from a silicon melt. The ingot is then eventually sawn into silicon wafers. Other examples are casting processes in which molten silicon is poured into molds or crystallization chambers and caused to solidify. In these casting processes, a polycrystalline product is obtained which is made up of monocrystalline regions oriented in a particular manner and, in doing so, develops a structure frequently described in technical language as a columnar structure (see, for example, U.S. Pat. Nos. 4,382,838 and 4,312,700). Various methods of pulling silicon ribbons or foils, for example, the method taught in U.S. Pat. No. 4,447,289, should also be noted.

An essential reason why the silicon is not used in coarse-fragment form in these processes, before melting, is that the volume of the melting crucible cannot be satisfactorily utilized. This is because with such a coarse material, the space is not filled efficiently. Even if the crucible is initially completely filled with coarse fragments of silicon, when melted, the crucible is generally only filled to about 30 to 50% with melted-down material. In addition, the reduction in volume of the silicon, in the order of about 10% which occurs during the melting process, must also be added to this reduction. At the same time, the entire crucible has to be heated so that only a comparatively small quantity of melt is obtained from the use of a large volume and a high energy input.

These disadvantages have been overcome by using finely divided to granular silicon which makes possible an appreciably more efficient utilization of the crucible volume provided. Such material may, for example, be produced by further comminuting ingots of pure polycrystalline silicon obtained by gas-phase deposition. These ingots typically have a length of 1 to 2 m and a thickness of 10 to 30 cm and are comminuted with the aid of steel jaw crushers or crushing mills after they have first been split into coarse fragments weighing typically about 0.05 to about 10 kg. The material obtained as a result of this operation, which varies within a wide grain size spectrum, is then, as a rule, sorted by metallic sieves, for example, into various grain size fractions. The intensive contact of the hard, brittle silicon particles with metallic materials, which is unavoidable in this operation, inevitably results in a contamination by abrasion. This contamination manifests itself all the more intensely, the finer the grain size of the silicon particles produced. Therefore, for applications in which the highest purity is of importance, such as in the Czochralski crucible pulling technique or in casting solar-cell base material, only silicon above a particular minimum grain size is generally used to keep the risk of entrainment of contaminants as low as possible. An appreciable proportion of the comminuted material, which is prepared at considerable expense, is therefore not available, or available only to a limited extent, for its originally intended application.

U.S. Pat. No. 4,565,913, assigned to Komatsu Electronic Metals Co., Ltd., discloses a known method for comminuting ingottype and billet-type polycrystalline semiconductor silicon in which the contamination problems are avoided. This method teaches briefly heating the ingots dielectrically from the interior with microwaves and shattering them. The fragments are collected in pure water, pure water optionally being sprayed on the periphery or the outer edge of the heated polycrystal. The particle size of the comminuted silicon can, in this case, be determined only by the size of the ingot-type polycrystal and the order of magnitude of the microwaves and cannot, therefore, be readily influenced. In U.S. Pat. No. 4,565,913, yet a further method is mentioned in which the ingots are heated to a high temperature by an external heating furnace and then thrown into water so that they are broken by the shock of rapid cooling. A disadvantage of this method is the unavoidable contamination of the broken parts through contact with other materials. In addition, there is only a slight possibility of influencing the size in which the fragments are finally produced on shattering.

SUMMARY OF THE INVENTION

It is an object of the invention to provide a method for comminuting solid fragments of silicon in a controlled matter with a low contamination risk, the material produced having a fine grain size meeting, in particular, high purity requirements.

It is yet another object of the invention to provide a method in which a block of silicon is thermally treated to produce fine stress fractures therethrough, but without the disintegration thereof, prior to comminuting.

These and related objects are achieved in the present invention by a method by which in a first step, the silicon fragments to be comminuted are decompacted (i.e., the strength of the solid is reduced by producing mechanical stresses therein). This is accomplished by first generating a temperature gradient within the piece of silicon by the action of externally applied heat producing a surface temperature of 400° to 1400° C. The surface temperature is then rapidly lowered, at least for a time, by a value of at least 300° C. The direction of the temperature gradient is then at least partly reversed, after which the decompacted silicon fragments are comminuted in a second step by the action of mechanical force.

The advantage of this method is that the comminuted silicon obtained has a uniform, high purity over the entire grain size spectrum produced. At the same time, the product has a small variation of fine grains so that high yields are systematically possible in the desired grain size spectrum. As a result of this, in the melting operation, the silicon can be taken in grain size distributions which make possible an optimum filling of the melting crucicle, or a continuous or cyclic recharging without the risk of splashes or damage to the crucible.

The method of the present invention can generally be used to comminute fragments or pieces of solid polycrystalline or monocrystalline silicon having masses of up to about 30 kg. Preferably, silicon pieces are selected whose mass is in the range from about 0.01 to 10 kg. Examples of suitable starting materials are, for instance, fragments of polycrystalline silicon ingots obtained by gas-phase deposition or endpieces which are separated for purity reasons from monocrystalline crucible-pulled ingots intended for component production, but whose purity is still adequate for the solar-cell base material which material has a less stringent purity requirement. In addition, the method can use block-type workpieces or the plate-type edge pieces which are separated from silicon which has been cast into molds and solidified. These pieces are present in the form of blocks, and can be further processed into solar cells. The starting materials mentioned here are, however, only to be understood as examples, but not in the sense of a restriction.

In a first step, the silicon fragments intended for the comminution are decompacted, i.e., cracks, fissures or mechanical stresses are produced in them which reduce the solidity and strength of the material and, at the same time, increase its tendency to fracture. In this connection, it is important for this step to be carried out in a manner such that the silicon taken does not shatter into individual pieces but essentially retains its original shape, since it has been found that, as a result of this, a looser intermediate product which is easier to comminute is obtained.

In the decompacting step, a temperature gradient, i.e., a temperature drop between the surface region and the interior, is first generated in the solid silicon fragments to be comminuted by the action of the externally applied heat. The surface temperature reached by the silicon fragments in this treatment may be varied between 400° and 1400° C. and is advantageously 600° to 1000° C. In this temperature range, the oxide formation on the surface of the silicon fragments is, as a rule, still so low that it is possible to work in air, thus making it unnecessary to use protective gases. At the same time, superficially adhering, volatile contaminants are removed in this first step.

To generate the temperature gradient, the fragmentary material is introduced into suitable furnaces, for example, box-type furnaces or muffle furnaces. Use of continuous furnaces is preferred. Generally, the furnace temperature is adjusted to the desired surface temperature value so that the silicon fragments cannot exceed this temperature. In that case, the silicon fragments do not need their own temperature control. It is, however, also possible to set to a higher furnace temperature than the intended surface temperature. This is particularly useful in treating fragments having a large mass and thus having a correspondingly sluggish heat-up behavior, particularly if short residence times are desired. In this situation, the surface temperature of the silicon fragments may be estimated, for example, visually on the basis of the incandescent coloration or may be monitored by means of pyrometers. Advantageously, the silicon fragments are exposed as directly as possible to the furnace temperature so that expensive pretreatments by preliminary heating can be dispensed with.

The residence time necessary for an ideal temperature distribution development at the furnace temperature established in a particular case, is expediently determined empirically on the basis of preliminary trials. In general, a longer residence time is required the greater the mass and, therefore, the heat capacity of the solid silicon fragments to be comminuted. It has also been found that polycrystalline material rich in grain boundaries requires different residence times than monocrystalline silicon, such as crucible-pulled or polycrystalline, for example, cast silicon, having fairly large monocrystalline regions and correspondingly fewer grain boundaries. In the case of silicon fragments having a mass of 0.1 to 10 kg and of furnace temperatures of 600° to 1000° C., residence times of 0.5 to 50 minutes have proven to be adequate in most cases, these values being understood as only a guide and not in the sense of a restriction.

It has frequently proven expedient, in particular, where silicon fragments to be comminuted have considerable variations in mass or size, to pre-sort them and then to treat them with different furnace temperatures and/or residence times in accordance with the mass or size fraction present. In this manner it is possible to prevent the unfavorable situation where, for example, with identical treatment, the small silicon fragments have already reached the furnace temperature and have a unifom temperature distribution, while at the same time, only a slight increase in temperature can be noted, particularly in the edge regions of the large fragments, with their interior still at the original temperature.

When the required surface temperature, which does not need to be the same for the individual specimens within the same batch, has been reached, and after a residence time which is adequate for generating a temperature gradient has elapsed, the next substep in the decompacting can be carried out. In this step, the surface temperature of the silicon fragments to be comminuted is rapidly lowered by a value of at least 300° C., preferably in a shock-like manner. Advantageously, this is done by quenching with fluids, such as, for example, cool inert gases, such as, nitrogen, argon or carbon dioxide, or liquids, such as, in particular, water. In that case, the surface temperature is lowered, at least for a short time, down to or below temperatures in the boiling range of the liquid used. Thus, if water is used to about 100° C.

To avoid contaminants, the fluids are used in the purest possible state. It is necessary to pay particular attention to the absence of substances which could possibly act as dopants. For example, the water, which is preferably used, is therefore advantageously used in distilled or demineralized form, or in a form purified by reverse osmosis.

The effect of lowering the surface temperature is that the direction of the temperature gradient inside the silicon fragments is at least partly reversed. As a result of this, a further stress field, at least partly opposite in direction, is superimposed on the thermomechanical stress field previously generated by the first substep. This results in the ideal development of fissures, cracks, fractures or mechanically unsound zones in the originally solid material, but without a disintegration of the individual pieces taking place at this time. Since, in this process, the material essentially retains its original shape, and, in particular, no new surfaces are produced which come into contact with the fluids, the risk of contamination remains low. In these regions, however, the cohesion of the silicon decompacted to such an extent can easily be finally overcome in a subsequent treatment step by the action of mechanical force.

The rapid lowering of the surface temperature is expediently carried out so that the fluid intended for the purpose is able to act on the surface in a manner which makes effective heat removal possible. This may be done, for example, by blowing a stream of a cooling gas which is inert towards silicon, under the existing conditions, over the heated silicon fragments. However, use of fluids in the liquid state is particularly advantageous, with water having proven particularly expedient owing to its ready availability, even in high purity, and its excellent environmental compatibility. The water is preferably sprayed on the surfaces to be cooled, and this can be done, for example, with the aid of systems of nozzles from which the water is released in the form of directed jets or in a mist-like dispersion. Another possibility is to provide one or more walls of water which superficially cools the silicon fragments as they penetrate the wall and move relative thereto. Furthermore, it is possible to immerse the heated silicon fragments for a short time in a water bath. These cooling operations employing liquids last preferably only to the extent that the residual heat left in the silicon fragments is sufficient to subsequently dry the surfaces and dispel any liquid residues left. Typical cooling times, in which the silicon fragments are therefore exposed to coolant, are in the range of 0.1 to 100 seconds. Generally, the cooling time chosen is longer, the larger the mass of the silicon fragments. For example, cooling times of 1 to 30 seconds have proven expedient in water cooling fragments having a mass of approximately 1.5 kg. The advantage of this method when compared with the method in which the material is quenched in a water bath and is left there to cool down completely is that subsequent drying steps can be eliminated.

The cooling-down operation is beneficially carried out in a cooling-down station which is charged with the fluid selected in the particular case and which has available suitable systems of nozzles and/or baths for applying it. Optionally, collecting containers for collecting and retreating the fluid are also provided. Expediently, this cooling-down station is joined directly to the station in which the substep for generating the first temperature gradient is carried out. Thus, when a continuous furnace is used, for example, the heated material can be quenched, if possible, without heat loss, and the drop in the surface temperature is as marked as possible. Such a cooling-down station may be constructed, for example, as a train of nozzles, through which the material to be quenched passes. Thus, it is possible for the material to be exposed to the cooling fluid from the nozzles once or several times. The effective cooling time can, at the same time, be influenced by means of the speed of passage.

The decompacted silicon fragments, which, as a rule, only alter their external shape slightly during the thermal treatment, are now subjected to the actual comminution step. Their loose and brittle consistency even makes it possible to use tools which are composed of silicon at least at the surface coming into contact with the silicon fragments, or are manufactured entirely from silicon, so that the risk of contamination is particularly low. In principle, the tools known for the comminution of fragmentary solids can be used, that is to say, jaw crushers or crushing mills, roller crushers or ball mills. Such tools manufactured from conventional materials, such as high-quality steel, can often be re-equipped or refurbished, for example, by coating their surfaces which come into contact with the material to be comminuted, with silicon. In addition, it may possibly be necessary to remove an appropriate part of the original material beforehand, for example, by etching or grinding. The silicon coating may, for example, be applied by gas-phase deposition (chemical vapor deposition) or by growth from the melt.

Another possibility is to provide, in a type of modular construction, suitably shaped, replacable silicon inserts or attachments which are mounted by clamping or bonding on a base of conventional material, which inserts optionally can be removed and replaced. In view of the mechanical sensitivity of the brittle silicon, this is an advantage whose importance must not be underestimated. Such modules are preferably manufactured from solid polycrystalline silicon, for which purpose use is made of the known techniques for shaping silicon, such as, for instance, grinding or sawing. In addition, material obtained from silicon powder by reaction bonding is also suitable. Such material is known, for example, from German patents Nos. DE A 3 236 276 or DE A 3 440 346 and is remarkable particularly for its ability to be easily formed and for its machineability. Finally, the use of material cast in suitable molds is also not ruled out.

The mechanical forces, which are markedly reduced compared with untreated material and which are necessary for the further comminution of the decompacted material, in principle, also make it possible to use other hard materials, since the risk of contamination through abrasion is small. This applies, in particular, to hard materials such as silicon nitride or silicon carbide which are remarkable for great hardness and minimum contamination risk, but also to other hard materials, such as, for example, titanium carbide, tungsten carbide, or types of steel with suitable hardness.

An indication of the reduced abrasion and the smaller mechanical loads is also the prolonged service lives of the tools used. The force exerted on the decompacted material with the aid of the tools mentioned here by way of example, crush, grind or split the silicon fragment into individual pieces so that a bed of silicon grains of various grain sizes is eventually obtained. The grain size distribution is, as a rule, such that virtually all the grains produced pass through sieves with mesh sizes of 10 to 30 mm.

The comminuted material produced may then be divided up into individual grain size fractions by a sorting step. Preferably, sorting devices are used for this purpose, such as sieves, grids or perforated trays, with the surfaces which come into contact with the product consisting of silicon. The comments already made in connection with the tools which effect the comminution apply analogously to the sorting devices provided.

In general, the size of the individual grains varies within the material produced so considerably that, during the sorting, fractions of finer and coarser and possibly also of medium grain size, can be separated therefrom in sufficient quantity. The maximum grain size selected in each case, which can be determined, for example, by means of the mesh size of the sieve used, depends ultimately on the intended application. Thus, different grain sizes will be used, for example, for a silicon powder from which inserts for melting crucibles are to be produced by reaction bonding under higher purity conditions than would be used, for example, for a powder charge intended as melting material which makes an optimum crucible utilization possible. In this connection, it is advantageous that the particles come into contact only with surfaces composed of silicon during the comminution step and consequently are correspondingly pure over the entire size spectrum so that particular minimum sizes do not have to be excluded from the outset for some applications.

If a particularly fine-grain product with average grain size in the range from 1 to 100 μm is required, it is generally necessary to subject the material obtained, which, as a rule, already belongs to a fine grain size fraction, to a further comminution step. For this purpose, impact or airjet mills, in which the contamination risk is known to be particularly low, are advantageously used. Silicon fragments which are left behind in the sorting step and exceed a particular, previously specified maximum size can be split off and made available for separate use. Preferably, however, they are again included in the process sequence and, optionally, are once again subjected successively to decompacting and subsequent comminution.

A wide variety of possible uses exists for the material comminuted by the method according to the invention. By way of example, it may be used as a melting material in the Czochralski crucible pulling technique, in the casting of block-type or foiltype solar-cell base material or as starting material in the production of high-purity reaction-bonded material.

These and other objects and advantages of the present invention will become apparent from the following description which discloses one embodiment of the invention.

DESCRIPTION OF THE PREFERRED EMBODIMENT

The invention will now be described in further detail with reference being made to the following example. It should, however, be recognized that the example is given as being illustrative of the present invention and is not intended to define the spirit and scope thereof.

Example

Fragments of polycrystalline silicon which had been obtained by fracturing ingots (diameter approximately 20 cm, length approximately 150 cm) produced by gas-phase deposition were provided for comminution; the mass of the individual fragments varied between approximately 20 and 1500 g; their maximum longitudinal extension varied between about 40 and 100 mm. This material was intended to be converted into grain sizes which are particularly well suited to the Czochralski crucible pulling technique, with masses in the range from approximately 0.02 to 10 g and whose maximum longitudinal extension is typically in the range from about 2 to 15 mm. At the same time, the objective was to minimize the proportion of fine grain which still passes through a sieve with a mesh size of 200 um, since this grain fraction is unpleasant to handle owing to the development of dust and is therefore usually not used.

Half shells manufactured from polycrystalline silicon were loaded with these fragments in charges of about 5 kg and then pushed into a resistance-heated muffle furnace set to a furnace temperature of approximately 800° C., where they were left for approximately 12 minutes. In preliminary trials, the temperature distribution had been determined at various depths of penetration in a silicon fragment weighing approximately 1.5 kg with the aid of thermocouples. For these measurement results, it was possible to conclude that the 12-minute heat treatment would cause the temperature at the surface of the silicon fragments to rise to values of 700° to 800° C., while a temperature difference of up to approximately 100° C. was established with respect to the interior of the fragments depending on mass and shape.

After the intended residence time had elapsed, the half shell was removed and the heated silicon fragments were tipped via a chute manufactured from a polycrystalline silicon into a water bath filled with water purified by reverse osmosis. There they were collected in a basket-like silicon collection container immersed in the water. The container with the fragments was removed from the water after about 8 seconds. The surface temperature of the silicon fragments, which had been lowered during this cooling operation by about 600° to 700° C. down to the boiling region of the water, then rose again slightly as a result of the residual heat present. The residual heat contributed to the result that liquid residues left behind were evaporated off within a short time and the product dried off completely. The decompacted silicon fragments obtained were essentially unchanged from their original external shape, but revealed a network of fine cracks on their surface.

As a test, one of the thermally treated silicon fragments was embedded in casting resin, sawn in the center and sectional micrograph of this surface was prepared. It could be seen that the interior of the body was also pervaded by fine cracks which apparently made easy comminution possible. In addition, the fine cracks did not allow the access of water or air, so that the development of a troublesome oxide skin is either eliminated or made difficult in the hot and correspondingly reactive state.

For the actual comminution, the decompacted silicon fragments were now transferred to a jaw crusher whose contact surfaces were composed of silicon, i.e., plates of solid, cast polycrystalline silicon approximately 1 cm thick were bonded onto the surfaces of the basic components which were manufactured from high-quality steel. The target grain size and also the intensity of the forces acting on the fragments were set by adjusting the jaw crusher.

Immediately after passing through the crusher, the fine-grain fraction (sieve size approximately 200 um) whose proportion was approximately 1% by weight, was separated off from the comminuted product obtained by means of several successive punched sieves manufactured from polycrystalline silicon. The material left behind was inspected visually for any oversized grains present in order to be able, if necessary, to decompact and comminute them again; such grains were not found. The proportion of iron in the final product was determined with the aid of the plasma-excited spectral analysis method (ICP technique) to be below 0.1 ppm by weight.

The product obtained was then used in a Czochralski crucible pulling process and a silicon monocrystal (p-doped) was pulled. The measurement of the conductivity of the latter yielded a value of 6.4 to 6.9 ohm cm and showed that no appreciable contamination of the silicon had occurred during the comminution process.

Comparison Example:

In a control experiment carried out as a comparison, solid silicon fragments of the same specification, as described above, were comminuted in the conventional manner by breaking them in a high-grade steel jaw crusher without a preceding decompacting step. The subsequent sorting yielded a comparatively considerably higher proportion of fine grain of 6.3 percent by weight which had to be separated off. The iron content of the material obtained was 20 ppm by weight. Consequently, an additional separation of the grain fraction up to 4 mm (sieve size) and an additional acid purification step for the removal of the contaminants, still present in the form of metal abrasions, was required. Only after these additional steps was it possible to produce a silicon ingot by the Czochralski crucible pulling technique carried out in an analogous manner whose conductivity was equivalant to the silicon ingot obtained from the material comminuted according to the invention.

While one example of the present invention has been described, it is obvious that many changes and modifications may be made thereunto, without departing from the spirit and scope of the invention.

What is claimed is:

1. A low contamination method for comminuting solid silicon fragments comprising the steps of:
    producing a first temperature gradient within said solid silicon fragments by establishing a surface temperature of 400° to 1400° C. on the surface thereof by the external application of heat
    producing a second, at least partially reversed, temperature gradient within the solid silicon fragment by rapidly lowering said surface temperature by at least 300° C.; and,
    thereafter comminuting the solid silicon fragments by the application of mechanical force.

2. The method, as claimed in claim 1, wherein the surface temperature is 600° to 1000° C. during the generation of the first temperature gradient.

3. The method, as claimed in claim 1, wherein solid silicon fragments having a mass of 0.01 to 30 kg are used.

4. The method, as claimed in claim 1, wherein the rapid lowering of said surface temperature is produced by quenching the solid silicon fragment with a fluid.

5. The method, as claimed in claim 4, wherein water is used as fluid.

6. The method, as claimed in claim 1, wherein the step of comminuting the solid silicon fragment is followed by a sorting step for sorting silicon grains produced during said comminution, said sorting step performed by a sorting means.

7. The method, as claimed in claim 6, wherein the sorting means has surfaces coming into contact with the comminuted silicon grains during the sorting step, said surfaces being composed of silicon.

8. The method, as claimed in claim 6, further including the step of recycling the silicon grains obtained in the sorting step exceeding a predetermined maximum size.

9. The method, as claimed in claim 1, wherein the comminuting step further includes applying the mechanical force with tools composed of silicon at least at the surface coming into contact with the silicon fragments.

10. The method, as claimed in claim 1, wherein the comminuting step further includes applying the mechanical force with tools composed of hard materials, at least at the surface coming into contact with the silicon fragments.

* * * * *